United States Patent [19]

Luce et al.

[11] 3,766,448

[45] Oct. 16, 1973

[54] INTEGRATED IGFET CIRCUITS WITH INCREASED INVERSION VOLTAGE UNDER METALLIZATION RUNS

[75] Inventors: Robert L. Luce, Los Altos Hills, Calif.; Earl S. Schlegel, Pittsburgh, Pa.

[73] Assignee: General Instrument Corporation, Newark, N.J.

[22] Filed: Feb. 4, 1972

[21] Appl. No.: 223,610

[52] U.S. Cl. ........... 317/235 R, 29/571, 317/234 N, 317/235 B, 317/235 G, 317/235 AG, 317/235 AH

[51] Int. Cl. ........... H01l 19/00

[58] Field of Search ........... 317/234 N, 235 AG, 317/235 B

[56] References Cited

UNITED STATES PATENTS

| | | | |
|---|---|---|---|
| 3,533,088 | 10/1970 | Rapp | 340/173 |
| 3,564,354 | 2/1971 | Aoki et al. | 317/234 N |
| 3,693,048 | 9/1972 | Doversberger et al. | 317/234 N |
| 3,675,091 | 7/1972 | Naomoto et al. | 317/234 N |
| 3,657,614 | 4/1972 | Cricchi | 317/235 B |
| 3,644,804 | 2/1972 | Schlegel et al. | 317/235 B |
| 3,430,115 | 2/1969 | Webb | 317/234 N |
| 3,450,965 | 6/1969 | Kubota | 317/234 N |
| 3,546,543 | 12/1970 | Hessinger | 317/234 N |
| 3,519,890 | 7/1970 | Ashby | 317/234 N |

*Primary Examiner*—John W. Huckert
*Assistant Examiner*—William D. Larkins
*Attorney*—Maxwell James et al.

[57] ABSTRACT

Inversion voltage in selected regions in an integrated array is increased by changing the geometry of the metallization overlying the thick oxide in the selected region. More particularly, metallization runs extending over functionally unrelated diffused regions in a semiconductor substrate are divided into a plurality of narrow stripes in the area between said unrelated diffused regions, whereby the subsequent alloying process is ineffective to "anneal out" the surface states or trapped charge at the substrate-oxide interface, thereby leaving a high inversion voltage at that region of the substrate so as to prevent unwanted channelling.

15 Claims, 7 Drawing Figures

INTEGRATED IGFET CIRCUITS WITH INCREASED INVERSION VOLTAGE UNDER METALLIZATION RUNS

This invention relates to semiconductor integrated microcircuits and more particularly to such circuits utilizing insulated gate field effect transistors (IGFETS).

The insulated gate field effect transistor is today becoming more and more prevalent as the active device commonly utilized in large-scale integrated circuit arrays. The most common IGFET utilized in today's semiconductor technology is the metal oxide silicon field effect transistor (MOSFET) which is a voltage-controlled device which exhibits extremely high input resistance. MOS technology is particularly adapted for use in large-scale complex integrated circuits because of its ability to integrate more functions on a chip and to give consistently higher processing yields than today's bipolar technology.

The typical MOSFET comprises an N type silicon substrate with two highly doped P type spaced regions diffused therein defining the output circuit terminals known as the source and drain. A thin insulating material, typically silicon dioxide, is disposed over the silicon substrate between the source and the drain to form the gate dielectric, upon which a metallic gate electrode is deposited.

In operation, the source is generally connected to the substrate and grounded and a negative potential is applied to the drain. The gate, which serves as a control electrode, is connected to the signal voltage and serves to modulate the resistance of the device. If the gate is at zero potential, no current flows from source to drain because the PN junctions are reverse biased. However, as the gate is made more negative, more and more positively charged holes are induced into the region at the substrate surface in the channel region. When enough holes have accumulated in the channel region, the surface of the silicon changes from electron dominated to hole dominated material and is said to have inverted; ohmic conduction occurs through the P-type channel created between the source and drain regions (such a device is thus referred to as a "P" channel device). Making the gate more negative increases the number of carriers in the channel and increases conduction.

The above described devices are "normal off," or enhancement mode devices, since conduction does not take place until a channel is formed by inversion. An N channel device operated in just the reverse manner with a channel which is electron dominated. In this case, there is a conducting channel between source and drain when no gate voltage is applied and the device is called a "normal on," or depletion mode device. In either case, the gate voltage level at which conduction beings is known as the threshold voltage $V_T$ of the device.

$V_T$ is generally determined at the time of fabrication of the device and is the function of such factors as doping levels, oxide thickness and dielectric constant and the particular metal used as the gate electrode. However, because conduction depends upon the mobile carrier density along the channel region, an additional factor is extremely important in determining threshold voltage. That factor is the surface state density which is a function of the degree of atomic disorder at the silicon oxide interface. Surface states capture an immobilize carriers at the interface that are induced into the channel region by the application of the gate field. Channel conduction does not occur until after these states are filled. The threshold voltage $V_T$ is increased to the level required to fill these centers.

In the past, it has been found that the deposition of a metal electrode on the silicon oxide followed by an alloying step at elevated temperatures, reduces or substantially eliminates the surface states at the oxide-silicon interface, thereby enabling fabrication of devices having threshold voltages which can be made usefully small. Indeed, recent advances in techniques for reducing surface state density have enabled manufacturers today to maintain the threshold voltages of MOS devices manufactured in a well controlled line generally below 5 volts. While this effect is quite desirable for manufacturing individual MOS transistors, it raises substantial problems in controlling surface inversion and stray capacitance within the silicon substrate in regions on an integrated array where an active device is not intended. Thus, to the extent that surface state density is reduced, the underlying semiconductor substrate is more easily affected by the conductive stripes or metallization runs deposited over the oxide. For example, if a metal line or stripe overlying the oxide layer crosses two isolated P-type regions and if the operating voltages on the line is higher than the inversion or threshold voltage, the P regions will not maintain their isolation and the circuit will fail.

Many previous attempts have been made to limit or counteract the effects of undesired inversion or parasitic transistor action in the semiconductor substrate underlying metallization runs. Thus such techniques as diffused "channel stops" and the use of doping with gold or other noble metals have been tried, but with little success. The channel stop techniques not only require additional masking steps, but they also require considerable additional surface area and thus severely limit the functional density of the resulting structures. The use of gold doping or other treatments have been found to have deleterious side effects such as increasing junction leakage.

In the prior conventional MOS processing, the oxide layer over the diffusion regions is relatively thin (comparable to the gate oxide) which resulted in undesirable stray capacitance. The solution to this problem lies in the now prevalent MTOS or thick oxide process. In devices constructed in accordance with this technique, a very thin insulating layer is provided over the gate region of the transistor and a much thicker insulating area is provided in all the remaining areas. The gate electrode is deposited on the thin oxide and ohmic connections are made to the source and drain areas by forming suitable apertures in the thick oxide and depositing conductive layers on the silicon substrate. The thick oxide layer is typically 14,000 – 16,000 A. thick while the thickness of thin oxide over the gate region should be about ten times smaller in order to provide a reasonable threshold voltage.

While the MTOS technique is reasonably successful in reducing stray capacitance, it is a far from satisfactory solution to the problem of surface inversion or parasitic transistor action under metallization runs. There is a limit to how thick the field oxide can be made as a result of the attendant loss in the accuracy of locating source and drain windows. The location of such windows or openings (through which the operative electrical connections are made) are extremely critical to the successful and uniform operation of these devices. Moreover, in forming passive elements such as resistors, where the length-to-width ratio is important, the difficulty of accurately locating openings in thick oxide are accentuated. Accordingly, the thickness of the field oxide is necessarily a compromise and results as best in an inversion or threshold voltage in the thick oxide region of perhaps 40 volts. As a result supply voltages are severely limited, thereby limiting attainable speed of operation.

Another suggested way in which parasitic conduction of the type described may be reduced involves the use of different insulating materials in the gate region as opposed to the remaining inactive areas of the chip. Thus an insulator material having a high dielectric constant might be chosen for the gate region and another material with a lower dielectric constant for the remainder of the micro circuit area. However, this suggested solution would require an entirely new and substantially more expensive processing technique and is thus generally considered commercially unfeasible.

Finally, more recently the use of barrier or so-called "field shield" structures has been suggested as a solution to the problem of undesirable field inversion. In accordance with this technique a barrier or shield, usually of a polycrystalline silicon, is deposited on the thin layer of oxide directly overlying a selected region of the silicon substrate prior to growing the thick field oxide. The buried polycrystalline silicon is thus effective to insulate against the field inversion effects of high voltages impressed upon the metallization runs over the selected area. The field shield process is disclosed more fully in the co-pending application, Ser. No. 111,497, filed on Feb. 1, 1971 by Frank M. Wanlass, et al., and assigned to the assignee of the present application. A related technique involving a three-layer sandwich structure is described in co-pending application, Ser. No. 168,630, filed Aug. 3, 1971, by Edward Russell and also assigned to the assignee of the present invention.

While these techniques have been found quite effective in reducing unwanted field inversion and/or enabling the use of a thinner field oxide, it will be apparent that they involve complex processing techniques which require additional masking and etching steps thereby materially increasing production costs.

It is a primary object of the present invention to provide an IGFET integrated circuit array wherein unwanted field inversion effects are substantially eliminated without the need for additional masking or etching steps or any decrease in functional density of the semiconductor wafer.

It is another object of the present invention to provide means to increase the inversion voltage in a silicon substrate underlying metallization runs without modifying the thickness or composition of the insulating layer therebetween.

It is yet another object of the present invention to design an integrated circuit array on a single substrate of semiconductor material wherein the operative electrical connections are made from metallization runs overlying an insulating layer and in which the surface state density at the interface between the substrate and insulating layer may be effectively controlled at selected regions by varying the geometry of the metallization runs in that region.

To these ends, the present invention relates to means for preventing unwanted field inversion in selected regions in a semiconductor integrated array by controlling the surface state density at the silicon-oxide interface in those selected regions. More particularly, the present invention is based upon our discovery that the extent to which the surface states at the silicon-oxide interface is "annealed out" upon heat treatment is a function of the geometry of that metallization. For example, we have found that the width of deposited and alloyed aluminum metallization strips to a large extent controls the resulting surface state density at the underlying substrate surface.

In accordance with this invention, in critical areas of the micro circuit susceptible to unwanted field inversion or parasitic transistor action in response to a voltage applied to the overlying conductor, that conductor is converted from a single wide stripe into a multisegment conductor having a plurality of closely spaced narrow stripes which together define the desired total conductor line width, but which drastically increase the threshold voltage required for inversion in the underlying semiconductor substrate. Indeed, it has been found that the alloying process when applied to conductive stripes having less than a predetermined width produces substantially no annealing of the surface state or trapped charge at the underlying silicon-oxide interface. Accordingly, merely by changing the metallization patterns in the selected regions, a high surface state charge density in those regions may be retained and unwanted field inversion is substantially eliminated.

The technique of this invention has been found particularly effective with aluminum conductors, but may be utilized with various other active metallization compositions and eliminates the necessity of additional masking and etching steps and selected variations in oxide thickness and/or composition.

To the accomplishment of the above, and to such other objects as may hereinafter appear, the present invention relates to a method and means for eliminating unwanted field inversion in integrated circuits under metallization runs as defined in the appended claims and as described in this specification taken together with the accompanying drawings in which:

Figure 5:
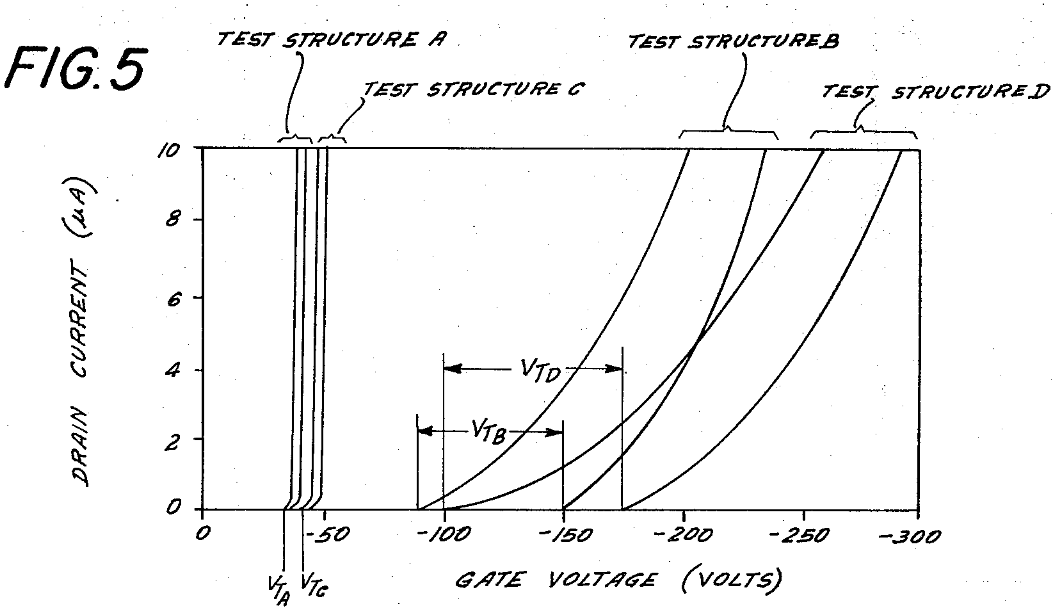
Figure 4A:
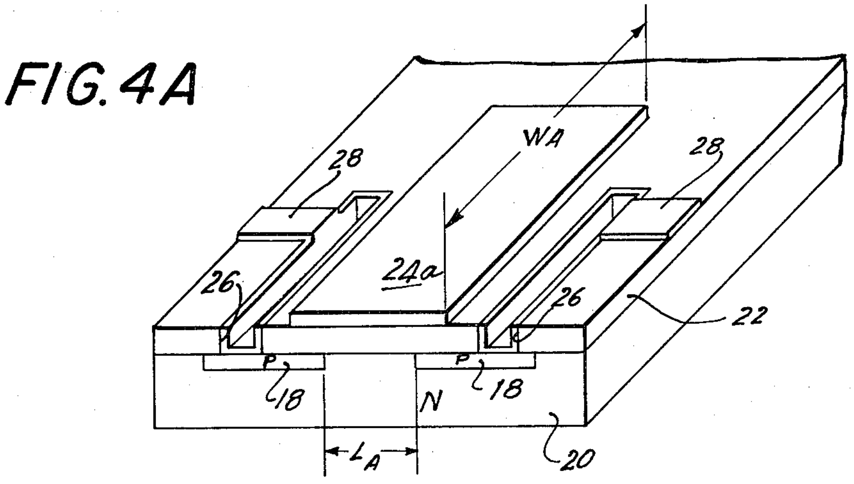
Figure 4B:
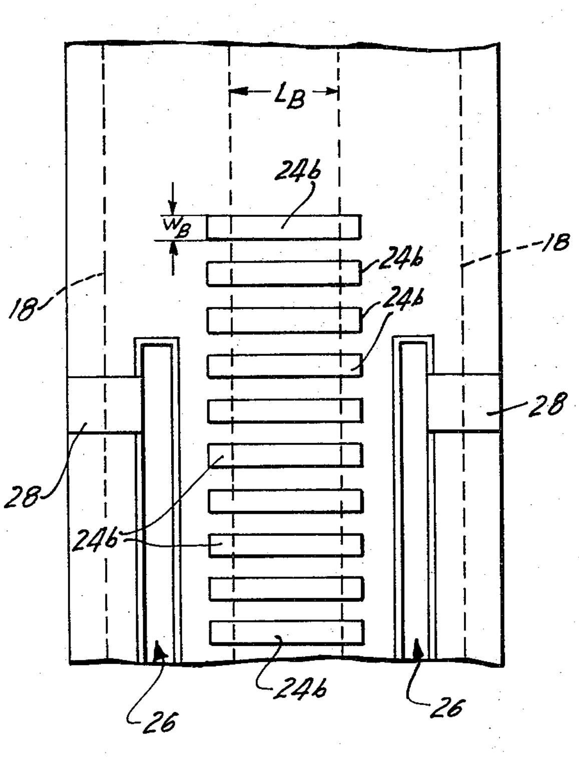
Figure 4C:
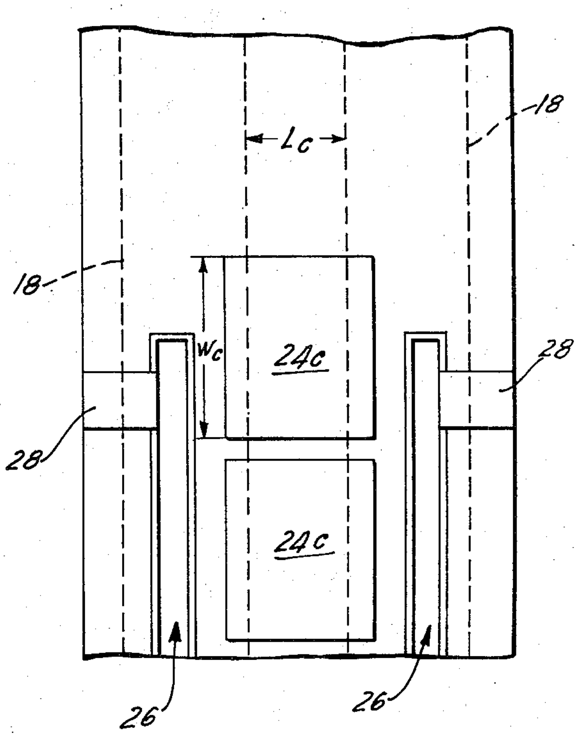

FIGS. 4*a*, 4*b* and 4*c* are schematic illustrations of P channel MOS test structures showing aluminum gate electrodes of various geometries; and FIG. 5 is a graphical representation showing the inversion voltage characteristics of the test structures of FIGS. 4*a*, 4*b*, 4*c*, and a control test structure.

In order to appreciate the problems of surface inversion and the advantages of applicant's solution thereto, a brief discussion of MOS processing is in order. While a variety of processing techniques have recently been developed, the most widely commercially utilized process is the thick oxide process referred to above.

The process begins by growing a thin (12,000A) layer of silicon dioxide on a n-type silicon wafer. An appropriate photolith sequence (masking and selective etching with a photoresist material) provides windows in the oxide. The remaining oxide acts as a mask against diffusion of the p-type dopant. Consequently, the oxide windows define the p-regions obtained after diffusion. During the last stage of diffusion of the dopant, a thick oxide (14,000A) is grown over the entire surface, leaving the p-regions buried underneath. A second photolith and etching operation is provided to cut through the thick oxide of the gate and contact regions. A very thin oxide is now regrown in the gate region (and unavoidably in the contact regions). The thickness of this oxide is carefully controlled to give the active device the proper threshold voltage. A third photolith and etching operation is effective to remove the unwanted oxide from the contact regions.

The metallization process is then performed to provide the operative electrical connections to and from the resistors and active transistors. Conventionally, a continuous metallic layer is vapor deposited on the entire wafer including the surface of the thick oxide (known as the "field oxide") and the thin gate oxide and into the contact openings in the thick oxide. The choice of metal is based upon its ability to make good ohmic contacts with the diffused regions and its effectiveness as a gate electrode. Aluminum has been found, thus far, to have the best characteristics for this purpose and is thus the most common metal used today.

The metallization pattern is then formed by a selective masking and etching process. It should be noted that compact design of large integrated arrays of the type here involved inevitably requires numerous metallization crossovers between closely spaced but functionally isolated diffused regions. The effective maintenance of isolation between such diffused regions without increasing the spacing thereof is the main rationale for reducing surface inversion effects during operation.

Finally, the wafer is subjected to an elevated temperature to alloy the deposited metal conductors. It is well known that this conventional heat-metallization process with an active metal such as aluminum results in a substantial reduction or complete elimination of the surface state density at the underlying oxide-silicon interface. Extensive studies have been made on this subject and it has been theorized that the aluminum (or other active metal) reacts with the hydroxyl groups or water in the oxide and releases hydrogen which then diffuses to the oxide-silicon interface where it reacts with vacancies and annihilates or "anneals out" fast states. A detailed discussion of this theory is presented in Cheroff et al. U.S. Pat. No. 3,445,924, issued May 27, 1969. It is this effect which enables the attainment of active MOS devices with desirably low threshold voltages. However, this annealing out of surface states takes place not only at the gate regions of active devices where it is desired, but also under all metallization runs along the entire wafer, thereby significantly increasing the possiblity of parasitic transistor action in regions underlying such metallization runs.

The present invention is based upon the discovery that this annealing out of surface states is dependent upon line width of the metallization stripes.

Figure 1:
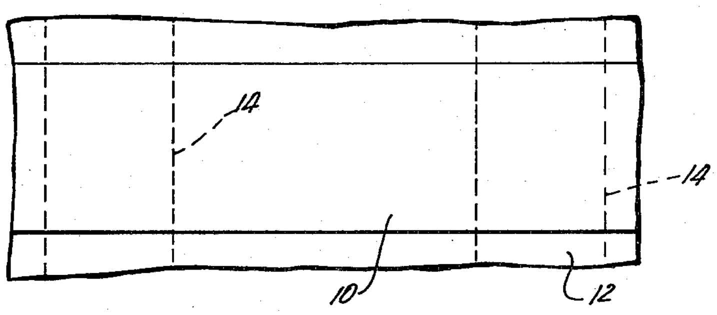
FIG. 1 is a schematic illustration of a conventional metallization stripe deposied over thick oxide and traversing two isolated P regions diffused on a semiconductor substrate.
Figure 3:
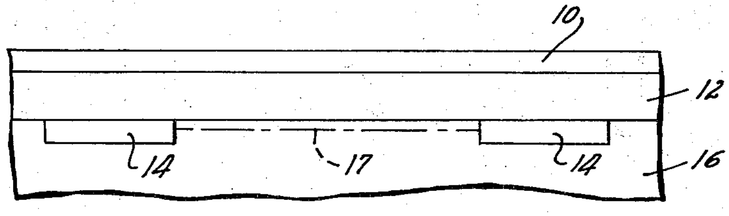
FIG. 3 is a cross-sectional view of the semiconductor regions of FIGS. 1 and 2.

FIG. 1 schematically illustrates a conventional metallization crossover stripe 10 deposited on a layer of thick oxide 12 and extending across two unrelated diffused regions 14 in the underlying semiconductor substrate 16. Typically, metallization runs of this type range in width from 0.5 mils to several mils depending upon the current carrying requirements. The crossover of FIG. 1 is illustrated in cross section in FIG. 3. As there shown in broken lines, an unwanted channel 17 may be formed at the surface of the silicon substrate as a result of inversion of substrate in response to the field associated with high voltages applied to the stripe 10. Conventionally, voltages as low as 35–40 volts may produce such channelling in regions underlying a typical thick oxide layer.

We have discovered that if a portion of the stripe 10 between the isolated diffused regions 14 is divided into longitudinally extending narrow segments prior to alloying thereof, the inversion or threshold voltage required to produce channelling in the underlying silicon substrate is substantially increased. This results from the fact that the annealing of surface states during the heat-metallization process decreases dramatically with decreases in the line width of the active metal.

Figure 2:
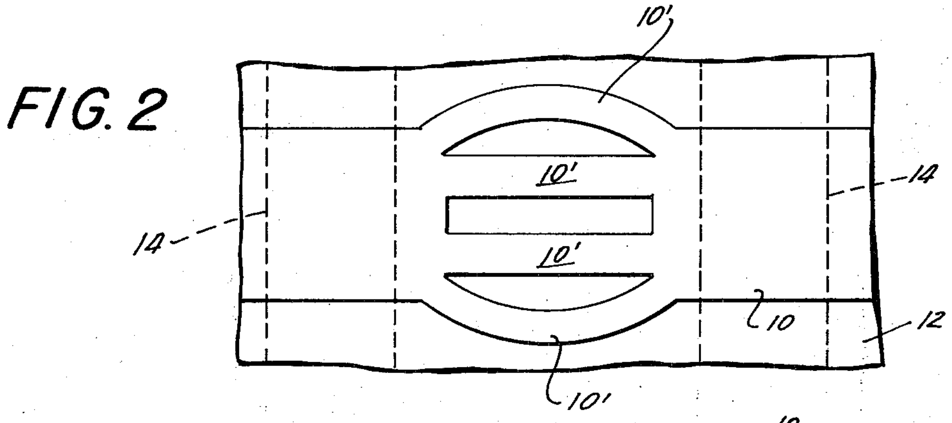
FIG. 2 is a schematic illustration of the same crossover metallization run of FIG. 1 modified in accordance with the present invention.

FIG. 2 is a schematic illustration of a crossover metallization stripe constructed in accordance with a preferred embodiment of our invention, like reference numerals designating like parts. As there shown, the conductive stripe 10 is converted into a multisegment conductor in the form of a plurality of narrow parallel stripes 10' in the region intermediate the diffused regions 14. These narrow stripes may be relatively short and closely spaced to conserve chip space without materially affecting the resulting high inversion voltage.

In order to illustrate the effect of line width of an active metal upon the inversion voltage in the underlying substrate, three different structures designated A, B and C as shown in FIGS. 4A, 4B and 4C, respectively, were tested. As illustrated, the test structures are p-channel MOS transistors each having two spaced p-regions 18 diffused in a silicon substrate 20 upon which a layer of thick field oxide 22 is grown. Aluminum gate electrodes of varying geometry are provided. Thus the gate electrode 24a in test structure A has a width $W_A$ of 5 mils and extends over a channel area having a length $L_A$ of 0.6 mils. Test structure B employs ten aluminum stripes 24b each having a width $W_B$ of 0.2 mils over a channel length $L_B$ of 1 mil. The gate in test structure C comprises two aluminum stripes 24c each having a width $W_C$ of 1.5 mil also over a 1 mil channel length $L_C$. The ohmic contacts to the source and drain regions are made through windows 26 in the oxide 22 by means of aluminum electrodes 28 deposited therein.

In addition, a fourth structure (herein referred to as test structure D) having the dimensions of test structure A but utilizing a gate electrode of conductive paste (not an active metal and not ordinarily suitable for MOS metallization) was used as a control.

Ten devices each of structures A and D were tested while six devices each of structures B and C were tested. The oxide under each of the gates was prepared by a process that is typical for the preparation of thick field oxides in the MOS microcircuit industry. It was 15,500 A. thick. The aluminum was evaporated to a thickness of 8,000 A. by electron bombardment, delineated and then alloyed at 500°C for twelve minutes in a dry nitrogen ambient.

The inversion voltages of these transistors were measured by recording the drain current as a function of the gate voltage with −5 V on the drain relative to the common source and substrate. The gates for test structures identified as structure D were formed by applying, at room temperature, droplets of conductive paste to the appropriate area of the chip, bridging two p-type regions after the wafer had been alloyed.

The graph of FIG. 5 shows that the inversion voltage for the devices having the narrow aluminum lines (test structure B) is practically the same as that for those having the conductive paste (test structure D). Thus, as shown, the inversion or threshold voltages for these devices range from approximately −90 to −175 volts, values well above even the highest supply voltages. The difference between the transconductances of these test structures (B and D) is due to the difference in the geometries of the transistor channels. Test structures A and C, by contrast exhibit the normally expected range of inversion or threshold voltages of from approximately −30 to −45 volts. The difference between the transconductances of test structures D and B and those of structures A and C is due to the presence of surface states in test structures D and B.

The difference between the inversion voltage of test structure A and C is typically found when transistors of different channel lengths are compared. This may probably be attributed to a variation in the dopant density of the silicon along the channel length due to compensation from the p-type diffusion layer and/or due to variation in the effective charge density in the oxide near a p-n junction. The fact that surface states are not annihilated beneath narrow metal lines might be due to an excape to the ambient of the species that is created by a reaction between aluminum and $SiO_2$ and which under wider metal lines migrate to the fast states and annihilate them. Whatever the theoretical explanation, however, we have found that the effects of surface states are substantially eliminated when the metal lines are reduced to a thickness of approximately 0.2 mils. Accordingly, in order to eliminate channeling between isolated diffused regions in a semiconductor integrated array the metallization masking pattern is modified to divide the normally wide metal stripes into a plurality of narrow stripes each nor more than 0.2 mils wide in at least one portion of its path between two unrelated diffusions, as illustrated in FIG. 2. The multisegment region may be as small as desired consistent with the selective etching capabilties of the metallization process. As a result, very little chip space is required and a modification of the general layout is unnecessary. The subsequent alloying process will have very little, if any, effect upon the surface states existing at the oxide-silicon interface underlying the thus formed narrow stripes, whereby the inversion voltage underlying the multisegment region of the metallization run is held at levels heretofore unattainable.

The use of selective metallization geometry as disclosed herein provides tremendous increased flexibility in the design of MOS integrated circuit arrays. Thus, not only does the present invention enable the use of drastically increased supply voltages, it may also facilitate the use of a thinner field oxide while maintaining good isolation between unrelated diffused regions. In addition, the spacing of those regions may be reduced to conserve additional chip space without sacrificing isolation. Moreover, all of the above is accomplished, in accordance with the present invention, merely by a variation in the geometry of the metallization mask at selected regions and requires no additional masking or etching steps, no selective changes in the oxide thickness or composition and indeed no change whatsoever in the existing basic fabrication process.

Finally, the discovery that surface states are not annihilated under narrow metal lines may have various other important implications for MOS technology. Thus, this discovery raises the possiblity that test structures might be designed for testing the electrical parameters in regions not covered by metal without the need for using awkward and tedious methods such as those involving conductive paste. (Conductive paste might contaminate the oxide and alter the characteristics that are to be measured.) Also, the use of thin metal lines rather than conductive paste makes it more practical to drift or measure the device parameters at elevated temperatures.

The fact that surface states are not annihilated under narrow metal lines can influence microcircuit behavior in a number of ways. The presence of surface states must be taken into account in the design of test structures for measuring the field inversion voltage in MOS microcircuits. The threshold voltage or transconductance of MOS transistors may be adversely affected by gate designs involving narrow metal lines. These considerations are of particular importance to designers of MOS microcircuits having gates of different widths or having high speed MOS transistors having a short channel length with a minimum of gate-drain overlap.

While only a single embodiment of the present invention has herein been specifically described, it will be appreciated that many variations may be made therein without departing from the scope of the invention, as defined in the following claims.

We claim:

1. In a semiconductor integrated circuit array comprising a semiconductor substrate, an insulating layer disposed over said substrate, a plurality of semiconductor devices integrated on said substrate and operatively electrically connected by a plurality of conductive stripes disposed on said insulating layer, said conductive stripes comprising an active metal alloyed at an elevated temperature on said insulating layer, the improvement comprising a selected region of at least one of said stripes being divided into a plurality of narrower stripes electrically connected in parallel defining a multisegment current carrying region having substantially the same current-carrying capacity as said one stripe, thereby to reduce the effects of alloying on the surface state density in the underlying substrate to increase inversion voltage at said selected region.

2. The integrated circuit array of claim 1, wherein said substrate is silicon.

3. The integrated circuit array of claim 2, wherein said insulating layer is silicon dioxide.

4. The integrated circuit array of claim 3, wherein said active metal is aluminum.

5. The integrated circuit array of claim 1, wherein said semiconductor substrate is of one conductivity type semiconductor material and at least two functionally unrelated spaced regions of the opposite conductivity type semiconductor material diffused in said substrate spaced from one another and functionally unrelated, said multisegment current carrying region of said at least one conductive stripe being defined in the area between said two diffused regions.

6. The integrated circuit array of claim 5, wherein said substrate is n-type material and said diffused regions are p-type material.

7. The integrated circuit array of claim 1, wherein at least some of said semiconductor devices are insulated gate field effect transistors.

8. The integrated circuit array of claim 7, wherein said insulated gate field effect transistors are of the metal oxide silicon type.

9. The integrated circuit array of claim 1, wherein said insulating layer is from 14,000–16,000 A. in thickness.

10. The integrated circuit array of claim 9, wherein said substrate is silicon.

11. The integrated circuit array of claim 10, wherein said insulating layer is silicon dioxide.

12. The integrated circuit array of claim 11, wherein said active metal is aluminum.

13. The integrated circuit array of claim 12, wherein said semiconductor substrate is of one conductivity type semiconductor material and at least two functionally unrelated spaced regions of the opposite conducitivity type semiconductor material diffused in said substrate spaced from one another and functionally unrelated, said multisegment current carrying region of said at least one conductive stripe being defined in the area between said two diffused regions.

14. A semiconductor integrated circuit array including a semicondcutor substrate, a layer of insulating material disposed on said substrate, a plurality of semiconductor devices integrated on said substrate, and electrically conductive means operatively electrically connected to at least one of said semiconductor devices, said conductive means being disposed on said insulating layer and having at least one region comprising plurality of segments electrically connected in parallel, and having substantually the same current carrying capability as said conductive means, each of said segments being not more than 0.2 mils wide in a direction transverse to their current carrying direction.

15. The integrated circuit array of claim 14, wherein said semiconductor substrate comprises one conductivity type material and further comprising at least two regions of the opposite conductivity type material diffused in said substrate spaced from one another and functionally unrelated, and wherein said at least one region of said conductive means is disposed in the area between said diffused regions in said substrate.

* * * * *